United States Patent
Lin et al.

[11] Patent Number: 6,127,276
[45] Date of Patent: Oct. 3, 2000

[54] METHOD OF FORMATION FOR A VIA OPENING

[75] Inventors: Shih-Yao Lin; Chih-Hsiang Chi, both of Hsinchu, Taiwan

[73] Assignee: United Microelectronics Corp, Hsinchu, Taiwan

[21] Appl. No.: 09/138,494

[22] Filed: Aug. 24, 1998

[30] Foreign Application Priority Data

Jun. 2, 1998 [TW] Taiwan ................................ 87108597

[51] Int. Cl.$^7$ ................................................. H01L 21/302
[52] U.S. Cl. ........................ 438/713; 438/714; 438/723; 438/738
[58] Field of Search .................................. 257/752, 751, 257/753, 755, 757, 758, 759, 760, 761, 765, 763, 764; 438/713, 714, 723, 724, 725, 738, 743, 751

[56] References Cited

U.S. PATENT DOCUMENTS

| | | | |
|---|---|---|---|
| 4,305,200 | 12/1981 | Fu et al. ............................ | 29/571 |
| 4,372,034 | 2/1983 | Bohr ................................. | 29/577 |
| 4,374,700 | 2/1983 | Scott et al. ...................... | 156/656 |
| 4,502,209 | 3/1985 | Eizenberg et al. .............. | 29/589 |
| 4,545,116 | 10/1985 | Lau .................................. | 29/591 |
| 4,570,328 | 2/1986 | Price et al. ...................... | 29/571 |
| 4,579,812 | 4/1986 | Bower ............................. | 430/313 |
| 4,593,454 | 6/1986 | Baudrant et al. ................ | 29/571 |
| 4,624,740 | 11/1986 | Abrams et al. .................. | 156/643 |
| 4,690,730 | 9/1987 | Tang et al. ...................... | 156/643 |
| 4,804,636 | 2/1989 | Groover, III et al. ........... | 437/52 |
| 4,818,723 | 4/1989 | Yen ................................... | 437/200 |
| 5,219,791 | 6/1993 | Freiberger ....................... | 437/195 |
| 5,234,864 | 8/1993 | Kim et al. ........................ | 437/197 |
| 5,300,813 | 4/1994 | Joshi et al. ...................... | 257/752 |
| 5,403,779 | 4/1995 | Joshi et al. ...................... | 437/190 |
| 5,420,078 | 5/1995 | Sikora ............................. | 437/228 |
| 5,426,330 | 6/1995 | Joshi et al. ...................... | 257/752 |
| 5,582,673 | 12/1996 | Burack et al. ................... | 156/285 |
| 5,610,099 | 3/1997 | Stevens et al. .................. | 437/192 |
| 5,883,436 | 3/1999 | Sadjadi et al. .................. | 257/760 |
| 5,888,309 | 3/1999 | Yu .................................... | 134/1 |
| 5,889,328 | 5/1999 | Joshi et al. ...................... | 257/751 |
| 5,935,876 | 8/1999 | Lee et al. ......................... | 438/738 |
| 5,950,107 | 9/1999 | Huff et al. ....................... | 438/669 |
| 5,976,975 | 11/1999 | Joshi et al. ...................... | 438/672 |
| 6,040,247 | 3/2000 | Chung ............................. | 438/713 |

*Primary Examiner*—Charles Bowers
*Assistant Examiner*—Laura M Schillinger
*Attorney, Agent, or Firm*—J.C. Patents; Jaiwei Huang

[57] ABSTRACT

A method for forming a via opening includes first an oxide layer formed over a metal layer. Next, a first stage via opening is formed on the oxide layer by photolithography and dry etching. Then, a wet etching process is performed on the first stage via opening to form a completed via opening to just exposes the metal layer and widen the width of the via opening.

19 Claims, 3 Drawing Sheets

METHOD OF FORMATION FOR A VIA OPENING

CROSS-REFERENCE TO RELATED APPLICATION

This application claims the priority benefit of Taiwan application Ser. No. 87108597, filed Jun. 2, 1998, the full disclosure of which is incorporated herein by reference.

BACKGROUND OF THE INVENTION

1. Field of the Invention

This invention relates to a semiconductor fabrication method, and more particularly to a method of formation for a via hole with a wet etching process.

2. Description of Related Art

In general, there are two typical processes used to form a via opening. They are a wet-dry etching process and a full dry etching process.

FIG. 1A and FIG. 1B are cross-sectional views schematically illustrating a conventional fabrication flow of formation of a via opening by a wet-dry etching process. In FIG. 1A, the wet-dry etching process first starts, for example, from a metal layer 10, which includes, for example, three sub-layers of Al/Ti/TiN. Then, an oxide layer 20 is formed over the metal layer 10, and a photoresist layer 25 is formed over the oxide layer 20. The photoresist layer 25 is to be used to pattern a via opening 30. The via opening 30 is formed by performing an isotropic wet etching process on the oxide layer 20. Next, in FIG. 1B, an anistropic dry etching process is further performed to completely form the via opening 30, which exposes the metal layer 10. During the dry etching process, some residual oxide (not shown) usually is deposited on the bottom of the via opening 30. In order to remove the residual oxide, a further etching process, called an over-etching process, is performed. The metal layer 10 is therefore etched out a little as shown in FIG. 1B. Even though this over-etching process can remove the residual oxide material, the Ti/TiN material on the top surface of the metal layer 10 is inevitable consumed, which causes the aluminum material to be exposed. This method increases probability that aluminum is eroded and increases an aspect ratio (AR) of the via opening, in which the AR is a ratio of the depth to the width.

Another conventional method of formation of a via opening is to use the full dry etching process. This conventional method uses only dry etching and is similar to the previous method except that it skips the wet etching in FIG. 1A. Since the dry etching is still used, an over-etching process is needed to remove the residual oxide material. This causes the same problems as those seen in the previous conventional method.

SUMMARY OF THE INVENTION

It is therefore an objective of the present invention to provide a method for forming a via opening including an additional wet etching process in order to reduce consumption of the surface metallic material of the metal layer. This reduces the probability of eroding aluminum and the AR of a via opening. The purpose of the additional wet etching is to take advantages of its high etching selectivity and isotropic etching behaviors.

In accordance with the foregoing and other objectives of the present invention, a method for forming a via opening provided by the invention includes first an oxide layer formed over a metal layer. Next, a first stage via opening is formed on the oxide layer by photolithography and wet etching. A dry etching process is performed on the first via opening to continuously form a second stage via opening on the oxide layer. Then, a wet etching process is performed on the second stage via opening to form a completed via opening, which just exposes the metal layer and has a wider width.

In accordance with the foregoing and other objectives of the present invention, another method for forming a via opening provided by the invention first includes formation of an oxide layer over a metal layer. Next, a first stage via opening is formed in the oxide layer by photolithography and dry etching. Then, a wet etching process is performed on the first stage via opening to form a completed via opening, which just exposes the metal layer and has a wider width.

BRIEF DESCRIPTION OF DRAWINGS

The invention can be more fully understood by reading the following detailed description of the preferred embodiments, with reference made to the accompanying drawings as follows.

DETAILED DESCRIPTIONS OF PREFERRED EMBODIMENTS

In the invention, an additional wet etching is included with the convention methods of using a wet-dry etching process or using a full dry etching process. Two preferred embodiments respectively corresponding to the two conventional methods are described below in detail.

EXAMPLE 1

Figure 1A:
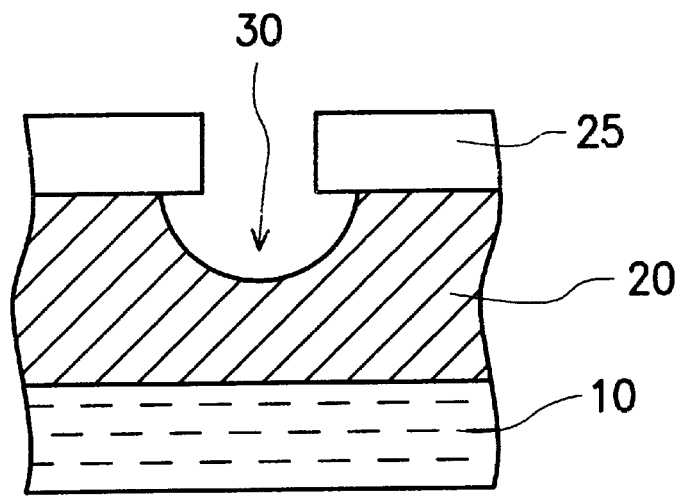
FIG. 1A and FIG. 1B are cross-sectional views schematically illustrating a conventional fabrication flow to form a via opening by a wet-dry etching process.
Figure 1B:
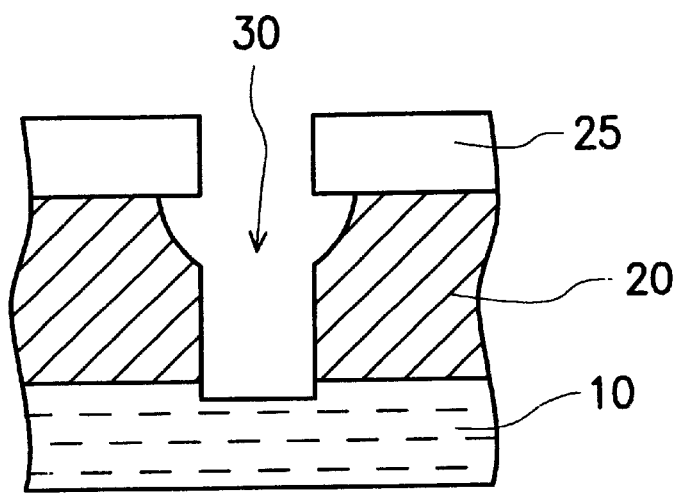
Figure 2A:
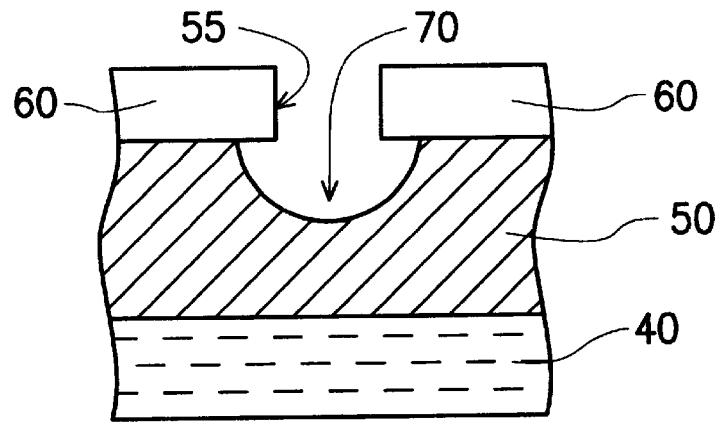
FIGS. 2A–2C are cross-sectional views schematically illustrating a fabrication flow to form a via opening, according to a first embodiment of the invention.
Figure 2B:
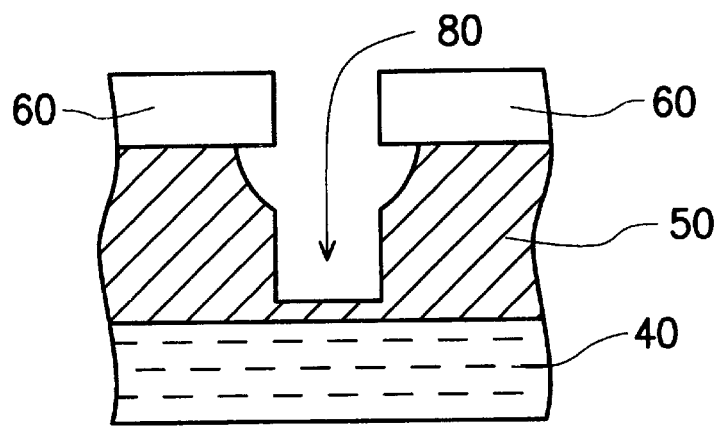
Figure 2C:
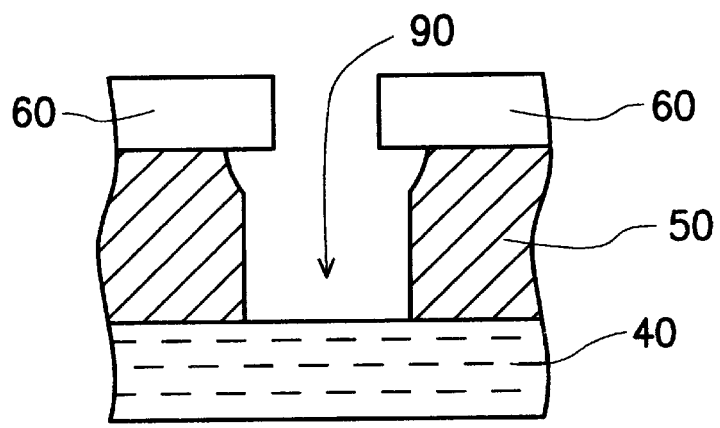

FIGS. 2A–2C are cross-sectional views schematically illustrating a fabrication flow of formation of a via opening, according to a first embodiment of the invention. In FIG. 2A, an oxide layer 50 serving as an insulating layer is formed over a metal layer 40. The oxide layer 50 includes, for example, silicon dioxide, borophosphosilicate glass (BPSG), or phosphosilicate glass (PSG), and the metal layer 40 includes, for example, three sub-layers of Al/Ti/TiN. Next, a first stage via opening 70 is formed by patterning the oxide layer 50 using photolithography and wet etching. It is done through forming a photoresist layer 60 with an opening 55 over the oxide layer 50 to serve as an etching mask, and performing a wet etching process on the oxide layer 50 to form the first stage opening 70. The etchant includes, for example, a mixed solution of hydrofluoric acid and ammonium fluoride. The depth of the first stage via opening 70 is controlled by the duration of etching time.

In FIG. 2A and FIG. 2B, a dry etching process is further performed on the first stage via opening 70 to form a second stage via opening 80, which does not expose the metal layer 40 yet, but the bottom of which second stage via opening 80 preferably has a distance less than about 2000 Å from the metal layer 40. The dry etching process includes, for example, a plasma etching. The etchant preferably includes an ion plasma mixed by CF4, $CHF_3$ argon and helium, because it has a better etching rate.

In FIG. 2B and FIG. 2C, a wet etching process is performed on the second stage via opening 80 to accomplish a via opening 90, which just exposes the metal layer. This wet etching process is the additional wet etching process mentioned in the beginning. It is chosen to have an etchant solution with a high relative etching selectivity on silicon dioxide to TiN. Thus, if an over-etching process is necessary to remove the residual oxide (not shown) deposited on the bottom of the via opening 90, the over-etching process used is the same as the additional wet etching process.

The additional wet etching process gives several properties to the via opening 90. Due to a large etching selectivity on the silicon dioxide to the TiN, the TiN material on the metal layer 40 is not consumed. The aluminum material is thereby not exposed, and is thereby not eroded. Since the wet etching process is isotropic, the width of the via opening 90 is widened so that the AR of the via opening 90 is reduced. This method is a wet-dry-wet etching process.

EXAMPLE 2

Figure 3A:
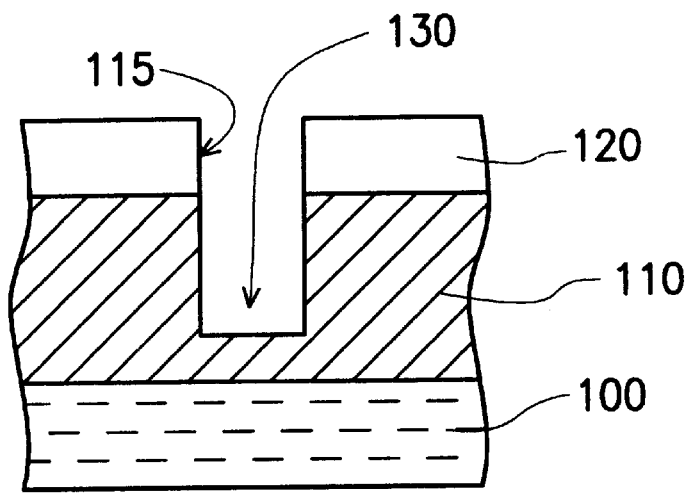
FIG. 3A and FIG. 3B are cross-sectional views schematically illustrating a fabrication flow to form a via opening, according to a second embodiment of the invention.
Figure 3B:
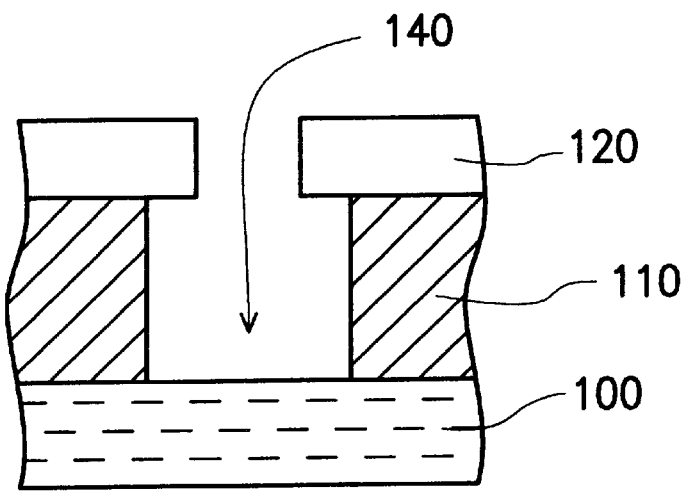

FIG. 3A and FIG. 3B are cross-sectional views schematically illustrating a fabrication flow of formation of a via opening, according to a second embodiment of the invention. In FIG. 3A, an oxide layer 10 serving as an insulating layer is formed over a metal layer 100. The oxide layer 110 includes, for example, silicon dioxide, borophosphosilicate glass (BPSG), or phosphosilicate glass (PSG), and the metal layer 100 includes, for example, three sub-layers of Al/Ti/TiN. Next a first stage via opening 130 is formed by patterning the oxide layer 110 using photolithography and dry etching. It is done through forming a photoresist layer 120 with an opening 115 over the oxide layer 110 to serve as an etching mask, and performing a dry etching process on the oxide layer 110 to form the first stage opening 130. The first stage opening 130 does not yet expose the metal layer 100, however, the bottom of the first stage opening 130 preferably has a distance less than about 2000 Å from the metal layer 100. The dry etching process includes, for example, a plasma etching. The etchant preferably includes an ion plasma mixed from CF4, CHF$_3$ argon and helium, because it has a better etching rate.

In FIG. 3A and FIG. 3B, a wet etching process is performed on the first stage via opening 130 to accomplish a via opening 140, which just exposes the metal layer 100. This wet etching process is the additional wet etching process as mentioned in the beginning. It is chosen to have an etchant solution with a high relative etching selectivity on silicon dioxide to TiN. Thus, if an over-etching process is necessary to remove the residual oxide (not shown) deposited on the bottom of the via opening 140, the over-etching process used is the same as the additional wet etching process.

The additional wet etching process gives several properties to the via opening 140. Due to a large etching selectivity of the silicon dioxide for the TiN, the TiN material on the metal layer 100 is not consumed. The aluminum material is thereby not exposed, and thus is not eroded. Since the wet etching process is isotropic, the width of the via opening 140 is widened so that the AR of the via opening 140 is reduced. This method is a dry-wet process.

In conclusion, the method of formation for a via opening of the invention is as follows:

1. An additional wet etching process with an etchant carrying high etching selectivity on the oxide layer to the metal layer is performed to accomplish the via opening. Thus the metal layer is not consumed and the high quality of the metal layer is assured. For example, the aluminum material of the metal layer is not exposed and thereby is not eroded.

2. Since the additional wet etching process is isotropic, the width of the via opening is widened and therefore the AR is reduced.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method of forming an opening, the method comprising:

forming an oxide layer over a metal layer;

patterning the oxide layer to form a first stage opening by a photolithography process and a wet etching process;

forming a second stage opening on the first stage opening by an anisotropic dry etching process, wherein the second stage opening does not expose the metal layer yet; and performing an additional wet etching process on the second stage opening to just expose the metal layer, wherein an etchant used in the additional wet etching process comprises a property of high relative etching selectivity on the oxide layer to the metal layer.

2. The method of claim 1, wherein the method further comprises an over-etching process to remove a residual oxide deposited on the bottom of the opening, wherein the over-etching process is the same as the additional wet etching process.

3. The method of claim 1. wherein the oxide layer comprises silicon dioxide.

4. The method of claim 1, wherein the oxide layer comprises borophosphosilicate glass (BPSG).

5. The method of claim 1, wherein the oxide layer comprises phosphosilicate glass (PSG).

6. The method of claim 1, wherein the metal layer comprises Al/Ti/TiN.

7. The method of claim 1, wherein the photolithography process to form the first stage opening on the oxide layer comprises a photoresist layer with an opening pattern formed over the oxide layer.

8. The method of claim 1, wherein an etchant used in the wet etching process to form the first stage opening comprises a mixed solution of hydrofluoric acid and ammonium fluoride.

9. The method of claim 1, wherein the bottom of the second stage opening has a distance of less than about 2000 Å from the metal layer.

10. The method of claim 1, wherein the anisotropic dry etching process in the step of forming the second stage opening comprises a plasma etching process with an ion plasma mixed by CF4, CHF$_3$, argon and helium.

11. A method of forming an opening, the method comprising:

forming an oxide layer over a metal layer;

patterning the oxide layer to form a first stage opening by a photolithography process and a dry etching process; and performing an additional wet etching process on the second stage opening to just expose the metal layer, wherein an etchant used in the additional wet etching process comprises a property of high relative etching selectivity on the oxide layer to the metal layer.

12. The method of claim 11, wherein the method further comprises an over-etching process to remove a residual oxide deposited on the bottom of the opening, wherein the over-etching process comprises the same etchant as the additional wet etching process.

13. The method of claim 11, wherein the oxide layer comprises silicon dioxide.

14. The method of claim 11, wherein the oxide layer comprises borophosphosilicate glass (BPSG).

15. The method of claim 11, wherein the oxide layer comprises phosphosilicate glass (PSG).

16. The method of claim 11, wherein the metal layer comprises Al/Ti/TiN.

17. The method of claim 11, wherein the photolithography process to form the first stage opening on the oxide layer comprises a photoresist layer with an opening pattern formed over the oxide layer.

18. The method of claim 11, wherein the bottom of the second stage opening has a distance of less than about 2000 Å from the metal layer.

19. The method of claim 11, wherein the etchant used in the dry etching process to form the second stage opening comprises an ion plasma mixed by CF4, $CHF_3$ argon and helium.

* * * * *